(12) United States Patent
Wang et al.

(10) Patent No.: US 6,319,754 B1
(45) Date of Patent: Nov. 20, 2001

(54) WAFER-DICING PROCESS

(75) Inventors: How-Shin Wang; Chun-Hung Lin, both of Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 09/613,553

(22) Filed: Jul. 10, 2000

(51) Int. Cl.[7] ................................................. H01L 21/50
(52) U.S. Cl. .............................. 438/113; 438/117; 438/464
(58) Field of Search .................................. 438/113, 464, 438/117, 100, 114, 118, FOR 386

(56) References Cited

U.S. PATENT DOCUMENTS 6,042,922 * 3/2000 Senno et al. .
6,204,092 * 4/1999 Freund et al. .

FOREIGN PATENT DOCUMENTS

06021219 * 1/1994 (JP) .
11017158-A * 1/1999 (JP) .

* cited by examiner

*Primary Examiner*—George Fourson
*Assistant Examiner*—Thanh V Pham
(74) *Attorney, Agent, or Firm*—Greenblum & Bernstein, P.L.C.

(57) ABSTRACT

A wafer-dicing process includes the steps of attaching the wafer to a wafer mounting sheet which includes a bonding adhesive layer, a releasable film layer, a resilient substrate layer, and a light-curable adhesive layer, laying assembly of the wafer and the wafer mounting sheet on a wafer carrier sheet, exposing assembly of the wafer, the wafer mounting sheet and the wafer carrier sheet to cure the light-curable adhesive layer, cutting the wafer to form bare dice, sucking one of the dice and pushing upwardly the carrier sheet, and moving and mounting the die to a die mounting substrate.

1 Claim, 3 Drawing Sheets

WAFER-DICING PROCESS

BACKGROUND OF THE INVENTION

1. Field of the Invention

This invention relates to a wafer dicing process, more particularly to a wafer dicing process employing a wafer mounting sheet that has multiple layers of different mediums with different bonding strengths.

2. Description of the Related Art

FIGS. 1 and 2 illustrate a conventional wafer-dicing process for cutting a wafer 101 into dice 106. The wafer-dicing process includes the steps of: attaching the wafer 101 to a wafer mounting sheet 100 which includes a bonding adhesive layer 102 adhered to the wafer 101 on one side and adhered to a releasable film 103 on the other side; peeling off the releasable film 103 from the bonding adhesive layer 102; attaching the bonding adhesive layer 102 of the assembly of the wafer 101 and wafer mounting sheet 100 to a resilient wafer carrier sheet 104, such as a blue tape; cutting the wafer 101 on the carrier sheet 104 with a cutter 105 to form dice 106 and a plurality of bonding adhesive layer sections 110 that are respectively adhered to the dice 106; sucking one of the dice 106 with a pick-up unit 108, such as a vacuum pad, and pushing upwardly the carrier sheet 104 with a pointed pin 107 to deform plastically the carrier sheet 104 so as to permit removal of the respective one of the bonding adhesive layer sections 110 from the carrier sheet 104; and through the use of the pick-up unit 108, moving and mounting said one of the dice 106, which has the respective one of the bonding adhesive layer sections 110 adhered thereto, to a die mounting substrate 109 in preparation for a subsequent operating step, such as a wire bonding step.

The aforesaid process is disadvantageous in that the bonding adhesive layer 102 tends to become contaminated during the aforementioned processing steps, thereby affecting adversely the bonding a strength of the bonding adhesive layer 102 upon adhering to the die mounting substrate 109. Moreover, in order to adhere the die 106 to the die mounting substrate 109 securely, the bonding strength of the bonding adhesive layer 102 is relatively strong to provide a sufficient bonding strength. However, such bonding strength tends to generate a bonding force between the bonding adhesive layer 102 and the carrier sheet 104 that is too strong to permit separation of the bonding adhesive layer 102 from the carrier sheet 104 during the sucking and picking operation, thereby causing deformation of the die 106 due to the pushing of the pointed pin 107 (see FIG. 3). There is also a possibility that a portion of the bonding adhesive layer 102 will remain on the carrier sheet 104, thereby further weakening the bonding quality between he bonding adhesive layer 102 and the die mounting substrate 109.

SUMMARY OF THE INVENTION

Therefore, the object of the present invention is to provide a wafer-dicing process that is capable of overcoming the aforementioned problems.

According to the present invention, a wafer-dicing process for cutting a wafer into dice, comprises the steps of: a) attaching the wafer to a wafer mounting sheet which includes a bonding adhesive layer adhered to the wafer, a releasable film layer adhered to the bonding adhesive layer, a resilient substrate layer attached to the releasable film layer, and a light-curable adhesive layer adhered to the resilient substrate layer, the bonding adhesive layer, the releasable film layer, the resilient substrate layer, and the light-curable adhesive layer being stacked one above the other; b) laying assembly of the wafer and the wafer mounting sheet on a transparent resilient wafer carrier sheet, and exposing assembly of the wafer, the wafer mounting sheet and the resilient wafer carrier sheet to cure the light-curable adhesive layer such that the light-curable adhesive layer adheres to the resilient wafer carrier sheet, wherein bonding strength between the releasable film layer and the bonding adhesive layer is weaker than those between the wafer and the bonding adhesive layer, the releasable film layer and the resilient substrate layer, the resilient substrate layer and the cured light-curable adhesive layer, and the cured light-curable adhesive layer and the carrier sheet; c) cutting the wafer on the carrier attached to the bare dice; d) sucking one of the dice with a pick-up unit and pushing upwardly the carrier sheet with a pointed pin to deform plastically the carrier sheet, the cured light-curable adhesive layer, the resilient substrate layer, and the releasable film layer of the respective one of the wafer mounting sheet sections so as to permit removal of the bonding adhesive layer of the respective one of the wafer mounting sheet sections, which is adhered to said one of the dice, from the releasable film layer of the respective one of the wafer mounting sheet sections; and e) through use of the pick-up unit, moving and mounting said one of the dice, which has the bonding adhesive layer of the respective one of the wafer mounting sheet sections adhered thereto, to a die mounting substrate.

BRIEF DESCRIPTION OF THE DRAWINGS

In drawings which illustrate an embodiment of the invention.

DETAILED DESCRIPTION OF THE PREFERRED EMBODIMENT

Figure 1:
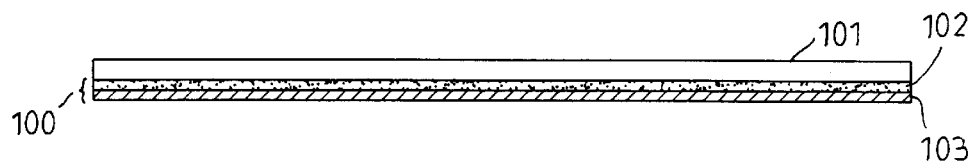
FIG. 1 is a schematic partly cross-sectional side view of a wafer with a wafer mounting sheet processed in a conventional wafer-dicing process.
Figure 2:
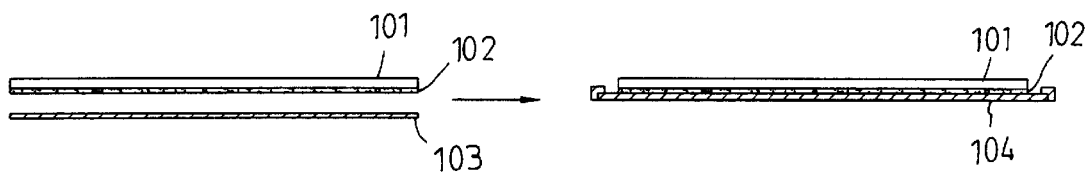
FIG. 2 shows schematic partly cross-sectional side views of the wafer and the wafer mounting sheet of FIG. 1 at different steps of the conventional wafer-dicing process.
Figure 2:
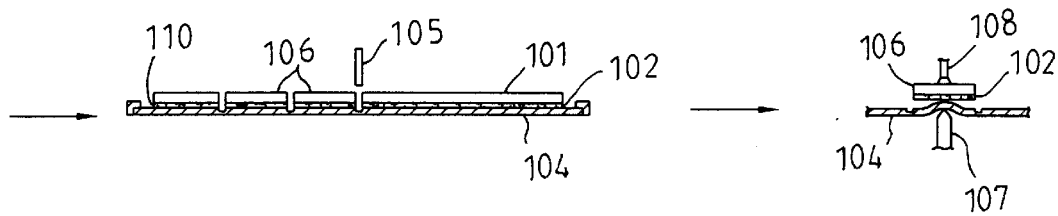
Figure 2:
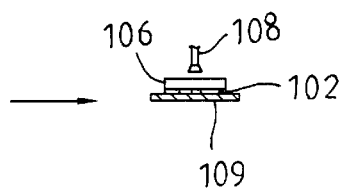
Figure 3:
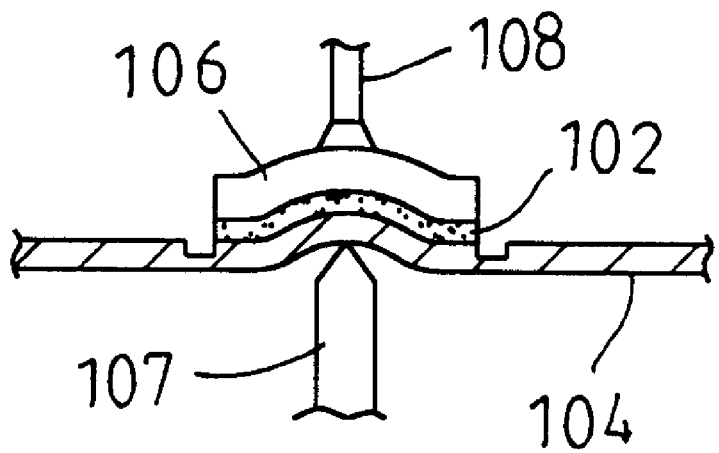
FIG. 3 is a schematic partly cross-sectional side view of a die that is deformed during a sucking and picking step of the conventional wafer-dicing process.
Figure 4:
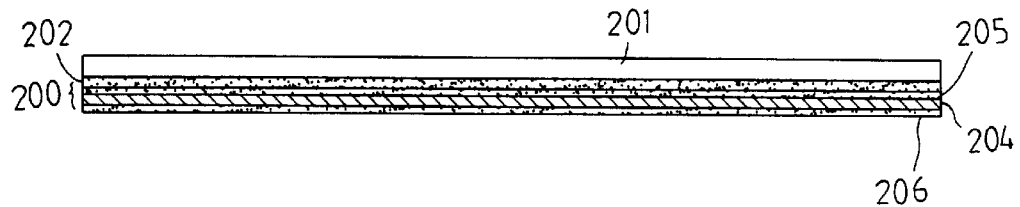
FIG. 4 is a schematic partly cross-sectional side view of a wafer with a wafer mounting sheet processed in a wafer-dicing process embodying this invention.
Figure 5:
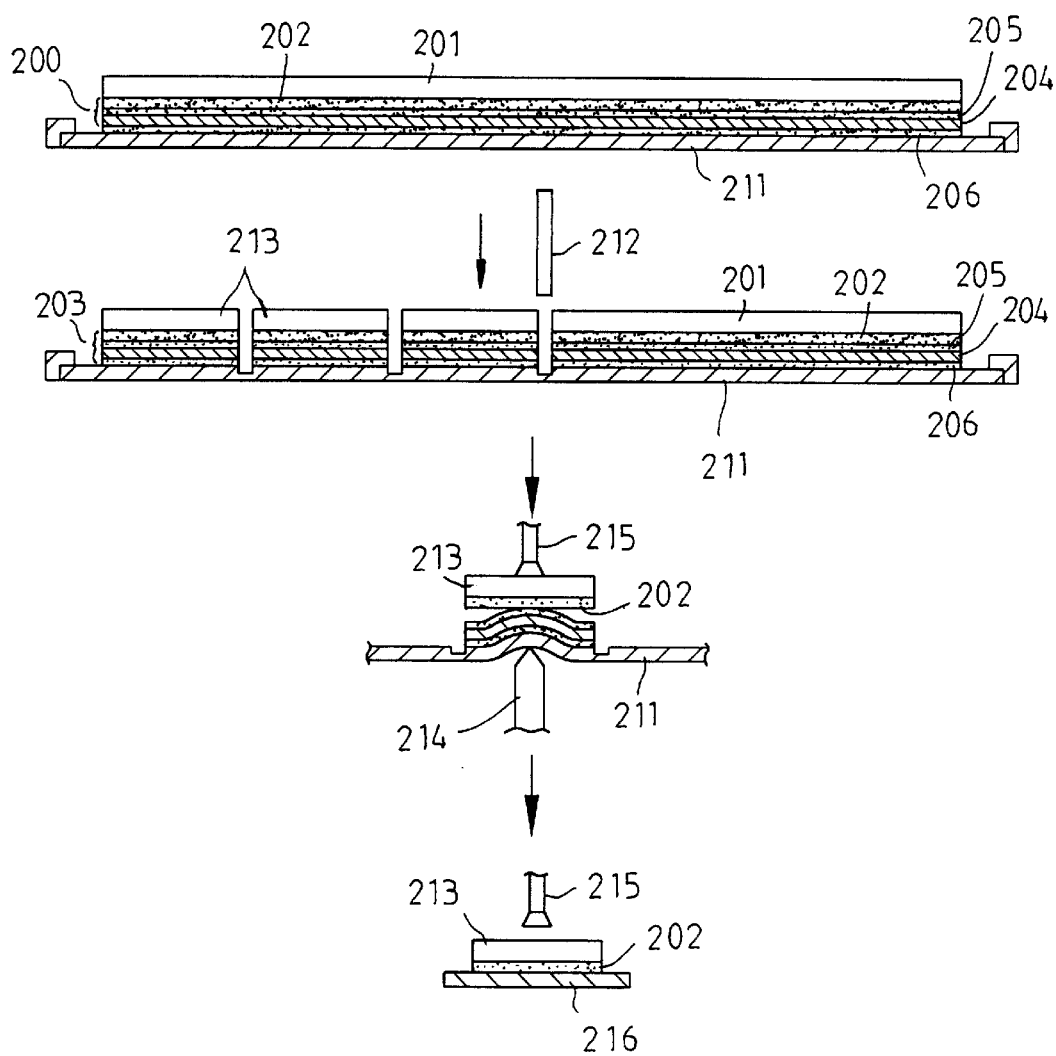
FIG. 5 shows schematic partly cross-sectional side views of the wafer and the wafer mounting sheet of FIG. 4 at different steps of the wafer-dicing process of this invention.

FIGS. 4 and 5 illustrate a wafer-dicing process embodying this invention. The wafer-dicing process involves cutting a wafer 201 into dice, and includes the steps of: a) attaching the wafer 201 to a wafer mounting sheet 200 which includes a bonding adhesive layer 202 adhered to the wafer 201, a releasable film layer 205 adhered to the bonding adhesive layer 202, resilient substrate layer 204 attached to the releasable film layer 205, and a UV light-curable adhesive layer 206 adhered to the resilient substrate layer 204, the bonding adhesive layer 202, the releasable film layer 205, the resilient substrate layer 204, and the light-curable adhesive layer 206 being stacked one above the other; b) laying assembly of the wafer 201 and the wafer mounting sheet 200 on a transparent resilient wafer carrier sheet 211 and exposing assembly of the wafer 201, the wafer mounting sheet 200 and the wafer carrier sheet 211 to UV light to cure the light-curable adhesive layer 206 such that the light-curable adhesive layer 206 of the wafer mounting sheet 200 adheres to the wafer carrier sheet 211, wherein bonding strength between the releasable film layer 205 and the bonding adhesive layer 202 is weaker than those between the wafer 201 and the bonding adhesive layer 202, the releasable film layer 205 and the resilient substrate layer 204, the resilient substrate layer 204 and the cured light-curable adhesive layer 206, and the cured light-curable adhesive layer 206 and the carrier sheet 211; c) cutting the wafer 201 on the carrier sheet 211 to form bare dice 213 and a plurality of wafer mounting sheet sections 203 that are respectively attached to the bare dice 213; d) sucking one of the dice 213 with a pick-up unit 215 and pushing upwardly the carrier sheet 211 with a pointed pin 214 to deform plastically the carrier sheet 211, the cured light-curable adhesive layer 206, the resilient substrate layer 204, and the releasable film layer 205 of the respective one of the wafer mounting sheet sections 203 so as to permit removal of the bonding adhesive layer 202 of the respective one of the wafer mounting sheet sections 203, which is adhered to said one of the dice 213, from the releasable film layer 205 of the respective one of the wafer mounting sheet sections 203; and e) through use of the pick-up unit 215, moving and mounting said one of the dice 213, which has the bonding adhesive layer 202 of the respective one of the wafer mounting sheet sections 203 adhered thereto, to a die mounting substrate 216 in preparation for a subsequent operating step, such as a wire bonding step.

Due to the configuration of the wafer mounting sheet 200, the contamination of the bonding adhesive layer 202 during the processing of the dicing and mounting steps as commonly encountered in the prior art can be eliminated. Moreover, with the light-curable adhesive layer 206, which provides the required bonding strength between the carrier sheet 211 and the cured light-curable curable adhesive layer 206 during the cutting step, it becomes feasible to have the bonding strength between the releasable film layer 205 and the bonding adhesive layer 202 to be weaker than those between the wafer 201 and the bonding adhesive layer 202, the releasable film layer 205 and the resilient substrate layer 204, the resilient substrate layer 204 and the cured light-curable adhesive layer 206, and the cured light-curable adhesive layer 206 and the carrier sheet 211, thereby facilitating the removal of the bonding adhesive layer 202 from the releasable film layer 205 without the aforesaid problems associated with the prior art.

The wafer mounting sheet 200 employed in the preferred embodiment of the present invention is available from Ablestik Co., a U.S. based company, under the trade name RP571-7B, and was designed specifically upon the request of the applicant to fulfil the requirements as set forth above.

With the invention thus explained, it is apparent that various modifications and variations can be made without departing from the spirit of the present invention. It is therefore intended that the invention be limited only as recited in the appended claims.

We claim:

1. A wafer-dicing process for cutting a wafer into dice, comprising the steps of:

a) attaching the wafer to a wafer mounting sheet which includes a bonding adhesive layer adhered to said wafer a releasable film layer adhered to said bonding adhesive layer, a resilient substrate layer attached to said releasable film layer, and a light-curable adhesive layer adhered to said resilient substrate layer, said bonding adhesive layer, said releasable film layer, said resilient substrate layer, and said light-curable adhesive layer being stacked one above the other;

b) laying assembly of said wafer and said wafer mounting sheet on a transparent resilient wafer carrier sheet, and exposing said light-curable adhesive layer in assembly of said wafer, said wafer mounting sheet and said wafer carrier sheet to cure said light-curable adhesive layer such that said light-curable adhesive layer adheres to said wafer carrier sheet, wherein bonding strength between said releasable film layer and said bonding adhesive layer is weaker than those between said wafer and said bonding adhesive layer, said releasable film layer and said resilient substrate layer, said resilient substrate layer and said cured light-curable adhesive layer, and said cured light-curable adhesive layer and said carrier sheet;

c) cutting said wafer on said carrier sheet to form bare dice and a plurality of wafer mounting sheet sections that are respectively attached to said bare dice;

d) sucking one of said dice with a pick-up unit and pushing upwardly said carrier sheet with a pointed pin to deform plastically said carrier sheet, said cured light-curable adhesive layer, said resilient substrate layer, and said releasable film layer of the respective one of said wafer mounting sheet sections so as to permit removal of said bonding adhesive layer of the respective one of said wafer mounting sheet sections, which is adhered to said one of said dice, from said releasable film layer of the respective one of said wafer mounting sheet sections; and e) through use of said pick-up unit, moving and mounting said one of said dice, which has said bonding adhesive layer of the respective one of said wafer mounting sheet sections adhered thereto, to a die mounting substrate.

* * * * *